United States Patent [19]

Fontanes et al.

[11] Patent Number: 4,954,961
[45] Date of Patent: Sep. 4, 1990

[54] METHOD OF DIGITALLY EVALUATING THE FREQUENCY AND THE PHASE OF SIGNALS, AND A DEVICE FOR IMPLEMENTING SUCH A METHOD

[75] Inventors: Sylvain Fontanes, Chatou; Patrice Birot, Courbevoie; André Marguinaud, Palaiseau, France; Thierry Quignon, Nanterre; Brigitte Romann, Boulogne Billancourt, all of Japan

[73] Assignee: Alcatel Espace, Courbevoie, France

[21] Appl. No.: 197,251

[22] Filed: May 23, 1988

[30] Foreign Application Priority Data

May 21, 1987 [FR] France ................... 87 07130

[51] Int. Cl.$^5$ ............................................. G01R 23/00
[52] U.S. Cl. ..................... 364/484; 364/725; 364/724.08; 364/724.09
[58] Field of Search .............. 364/484, 725, 724.08, 364/724.09

[56] References Cited

U.S. PATENT DOCUMENTS 4,361,875 11/1982 Hertz et al. .................... 364/724.08
4,534,043 8/1985 Krishnan ........................ 364/724.09
4,644,268 12/1987 Malka et al. .

FOREIGN PATENT DOCUMENTS 0107884 5/1984 European Pat. Off. .
0166839 1/1986 European Pat. Off. .
0186521 7/1986 European Pat. Off. .

OTHER PUBLICATIONS

Bellanger, "Digital Processing of Signals", John Wiley, 1984, p. 350.
Signal Processing, vol. 11, No. 2, Sep. 1986, pp. 169–177, Amsterdam, NL; D. R. A. MacMahon et al.: "An Efficient Method for the Estimation of the Frequency of a Single Tone in Noise from the Phases of Discrete Fourier Transforms".

Primary Examiner—Emanuel S. Kemeny
Attorney, Agent, or Firm—Sughrue, Mion, Zinn, Macpeak & Seas

[57] ABSTRACT

A method of digitally evaluating the frequency and the phase of signals in the form of digitized samples, the method being wherein it comprises in succession:
a stage during which numbers corresponding to the samples of the signal to be analyzed are processed in order to convert them into the form of an analytic signal whose real portion coincides with said signal to be analyzed; and, in parallel therewith:
a stage of estimating the parameters to be analyzed which is performed in an overall manner on the basis of estimators and of selection criteria by working on the phase of the signal without using any operator of the Fourier transform type or any hypothesis test either separately or simultaneously; and
a stage of estimating the differences between the real signal as taken in this way and the signal obtained from the estimated parameters, thereby making it possible to deliver data in digital form relating to the quality of the analyzed signal and to the reliability of the estimated values. The invention is applicable, in particular, to microwaves.

4 Claims, 4 Drawing Sheets

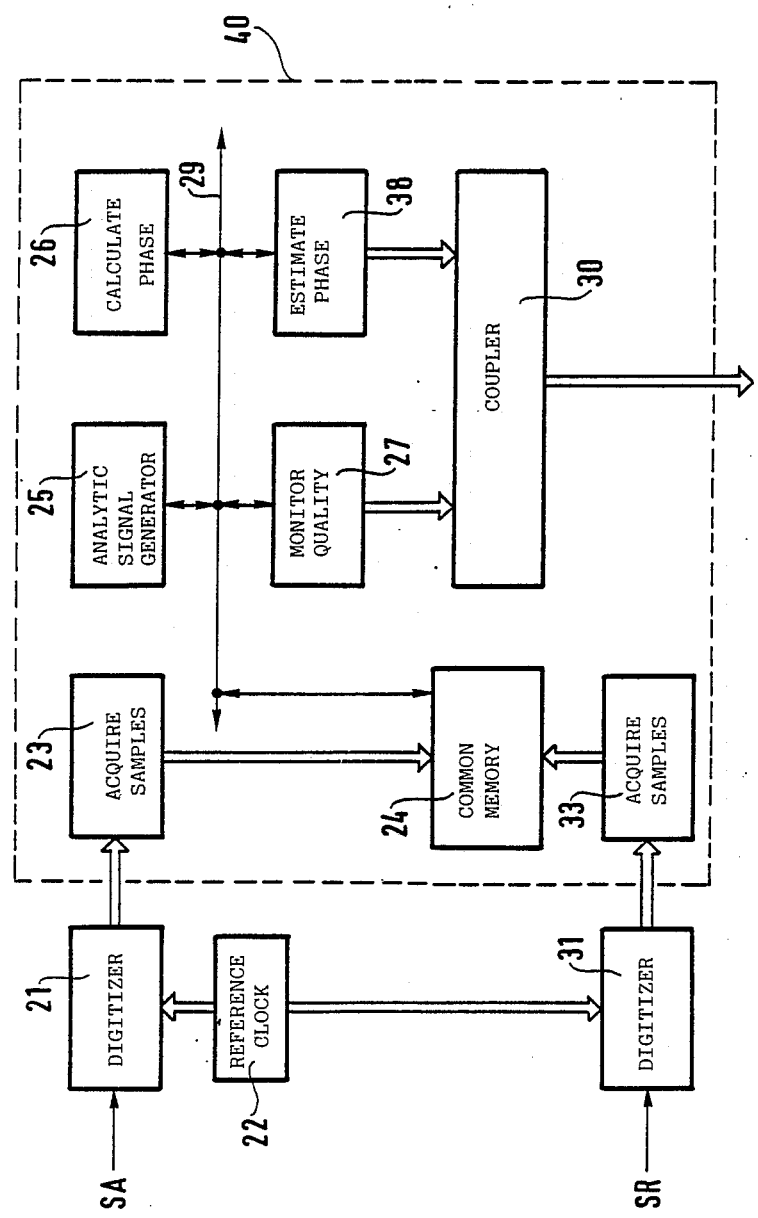

METHOD OF DIGITALLY EVALUATING THE FREQUENCY AND THE PHASE OF SIGNALS, AND A DEVICE FOR IMPLEMENTING SUCH A METHOD

The invention relates to a method of digitally evaluating the frequency and the phase of signals, and to a device for implementing such a method.

BACKGROUND OF THE INVENTION

As in a conventional frequencymeter or phasemeter, it serves to reconstitute respectively the frequency or the phase of the signal to be evaluated, and to provide an indication of the accuracy with which these parameters are measured together with items for determining the quality of the signal (e.g. signal/noise ratio, form factor).

The signal analysis methods commonly used for measuring frequency and phase are generally based either:
- on analog processing and filtering methods for performing interation or counting zero crossing, with the duration of the integration or the filtering being a function of the desired accuracy or:
- on methods for locking an oscillator, for example by means of a phase lock loop, thereby isolating the signal to be measured so that measurements can then be performed thereon; or else;
- directly on the signal from the locked oscillator, or on the control signals thereof.

The use of these methods suffers from the drawback of not storing the results of earlier processing. As a result, any parameter value estimated from one portion of the signal, is actually made use of in processing a different portion of the signal subsequent to the portion which was used for obtaining the initial estimate, and this has unfortunate consequences both:
- on performance, since this technique cannot provide the best possible adaptation to variability in the parameters, and as a result it is more sensitive to disturbing signals (noise, interfering spectrum lines) superposed on the signals to be measured; and also
- on complexity, since when using the above-described techniques, it is very difficult to provide optimum adaptation at each of the stages that need to be implemented in order to achieve the desired aim. In particular, the stages of acquisition and of tracking require different characteristics, so they either separate devices, or else they require the characteristics of a set of analog circuits to be adapted to each of these stages, and thus without excessive complication, it is very difficult for the measuring device to be optimally adapted and give best results for each of these stages.

Further when performing successive estimates of the same parameter, it is not possible to use the same signal. The results of successive estimates are thus performed over signal periods taken successively in time, which makes it essential to use hypotheses which are guaranteed to provide valid and reproducible results.

The object of the present invention is to mitigate these drawbacks.

SUMMARY OF THE INVENTION

For this end, the present invention provides a method of digitally evaluating the frequency and the phase of signals in the form of digitized samples, wherein the method comprises in succession:
- a stage during which numbers corresponding to the samples of the signal to be analyzed are processed in order to convert them into the form of an analytic signal whose real portion coincides with said signal to be analyzed; and, in parallel therewith:
- a stage of estimating the parameters to be analyzed which is performed in an overall manner on the basis of estimators and of selection criteria by working on the phase of the signal without using any operator of the fourier transform type or any hypothesis test either separately or simultaneously; and
- a stage of estimating the differences between the real signal as taken in this way and the signal obtained from the estimated parameters, thereby making it possible to deliver data in digital form relating to the quality of the analyzed signal and to the reliability of the estimated values.

These various stages are advantageously provided by means of a set of equipment comprising a digitizer and a calculating member, suitable for accepting a wide variety of signals and for delivering the desired parameters.

Advantageously, in the stage for estimating the parameters to be analyzed, the phase of the analytic signal is replaced by its associated developed phase.

It is possible to use unbiased estimators with minimum variance in the method of the invention, thereby making it possible to optimize the duration of the processed signal.

Further, the estimate of the degree of conformity in the analyzed signal makes it possible to eliminate jamming, in particular when the signal to be analyzed is fleeting. This makes it possible to consider extracting the parameters characteristic of a short signal, assuming that the probable instant of its arrival is known, or to determine the instant at which a signal of known characteristics, does in fact, appear. For example, in the case of a message which is transmitted periodically or randomly, the method may be used either:
- to determine the precise instants at which the message begins, thereby making it possible subsequently to extract its characteristics; or else
- if the message has characteristics which are accurately known, and arrives at random instants in time, to determine the beginning-of-message instants.

More precisely, in the method of the invention, the initial samples are stored in a memory from which they are extracted as often as may be required by each new calculation giving rise, to within given accuracy, to the signal/noise ratio of the analyzed signal, to the duration of the signal to be taken into account, and to the accuracy of the phase measurement and of the frequency measurement, with the above being based on a given quality parameter.

Such a method may be applied to sinusoidal signals having noise or harmonics due to non-linearities added thereto.

It may be applied to signals of arbitrary shape (e.g. square, triangular, or Gaussian), for the purpose of determining accurate shape characteristics in addition to the frequency and the phase.

The invention also relates to a device for implementing the method.

This device, for example a frequencymeter, comprises a digital processor member having an input to which the signal to be analyzed is applied after passing through a digitizer, said digitizer also receiving a stable digital clock signal, with the output from the digital processor member providing a quality signal and a frequency measurement signal.

Advantageously, this digital processing member comprises:
- a common memory circuit;
- a circuit for generating the analytic signal;
- a circuit for calculating samples of the phase of the analytic signal and for constructing the developed phase;
- a circuit for determining the quality of the signal and enabling an estimate to be made of the statistics of the differences from the estimated sinewave and the estimated noise as a function of the form of the signal to be analyzed;
- a circuit for estimating frequency;
- with all of the above circuits being connected via respective both-way links to an interconnection bus;
- an input circuit for acquiring digitized samples, said circuit being connected to the common memory via a one-way link; and
- a coupler having its inputs connected to the outputs from the circuit for determining the quality of the signal and from the circuit for estimating its frequency, and whose output constitutes the output from said processor member.

This device could also be a phasemeter, in which case it would include a second digitizer receiving firstly a phase reference signal and secondly the stable reference clock signal, and the processing member would further comprise:
- a second circuit for acquiring digital samples of the phase reference signal and connected like the first sample acquisition circuit to the common memory circuit; and
- a circuit for estimating the phase relative to the reference signal, and for estimating the jitter.

Advantageously, these devices are physically constituted by using a hardware structure comprising a plurality of mutually independent calculation units which share the various calculation tasks required for the analysis and which have access to the memory means which serve to interconnect said calculation means, said addressable memories being either common (bus or multiport), or else constituted as a lattice network, with an exclusive zone being attributed to each calculation member for writing in memory.

BRIEF DESCRIPTION OF THE DRAWINGS

Embodiments of the invention are described by way of example with reference to the accompany drawings, in which:

FIGS. 5 and 6 are block diagrams of two devices for implementing the method of the invention.

MORE DETAILED DESCRIPTION

Figure 1:
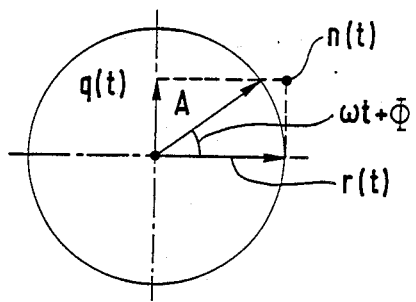
FIGS. 1 to 4 are diagrams showing the operation of constructing the developed phase.

The method of the invention comprises:

A stage in which the signal to be analyzed is transformed into digital samples. These samples are taken directly from the signals to be processed and are stored in an addressable digital memory. Methods of digitizing a signal, and of storing the digital samples are known. They can be implemented using architectures based on components which are commercially available.

A stage in which the numbers obtained in this way and representative of the signal to be analyzed are processed in order to put them into the form of an analytic signal whose real part coincides with the original signal.

A stage during which the parameters to be analyzed are estimated on the basis of estimators and selection criteria operating on the phase of the analytic signal (modulo $\pm\pi$) which is replaced by its associated developed phase in order to simplify processing.

The term "modulo $\pm\pi$" is used throughout this specification, by analogy with "modulo n" to have the following meaning:

($\Phi_i$ = calculated phase; $\Phi$ = phase modulo $\pm\pi$)

if $-\pi \leq \Phi_i < +\pi$ then $\Phi = \Phi_i$ if $+\pi \leq \Phi_i$ then $\Phi = \Phi_i - 2k\pi$ if $\Phi_i < -\pi$ then $\Phi = \Phi_i + 2k\pi$ with k being a positive integer chosen so that $-\pi \leq \Phi < +\pi$.

A stage for estimating the difference between the real signal as defined above and the signal obtained from the estimated parameters, thereby making it possible to deliver data in digital form relating to the quality of the analyzed signal and also to the reliability of the estimated values (form factor, additive noise, interfering spectrum lines), with these judgment criteria naturally be a function of the characteristics of the estimator used.

Background required for understanding the method and relating to the analytic signal and the developed phase are recalled below.

The method of the invention is based on using mathematical principles which are known elsewhere and whose results are recalled below, and on an original method of constructing the developed phase of a signal which is described below.

The concept of an analytic signal associated with a real signal r(t) was introduced by Ville. This concept, limited to the case of "finite energy" signals (which corresponds to the kinds of signal that are normally processed), serves to associate a real signal r(t) with a second function q(t) of the same type such that the complex function:

$$x(t) = r(t) + jq(t)$$

has a spectrum without any negative frequency components.

The function x(t) is the "analytic signal" and the function q(t) is the "quadrature signals", both of which are associated with the given function r(t).

Thus, for a sinusoidal signal:

$r(t) = A \cos(2\pi\nu t + \phi) = $ real part of $A \exp[j(2\pi\nu t + \phi)]$ $q(t) = A \sin(2\pi\nu t + \phi) = $ imaginary part of $A \exp[j(2\pi\nu t + \phi)]$ where $x(t) = A \exp[j(2\pi\nu t = \phi)]$ This concept, when applied to finite energy real signals possessing a fourier transform, provides a method of calculation for deducing the quadrature signal form the real signal r(t), and thus of associating with r(t) the complex function x(t) having no negative frequency components, thereby making it possible to isolate the amplitude and the phase of the corresponding signal.

Thus, if:

$$r(t) = \int_{-\infty}^{+\infty} R(v) \cdot \exp(j2\pi vt) dv$$

where R(v) is the fourier transform of r(t), thus making it possible to calculate:

$$q(t) = \int_{-\infty}^{+\infty} Q(v) \cdot \exp(j2\pi vt) dv$$

where Q(v) is the fourier transform of q(t) such that:

$$Q(v) = -jR(v) \text{ if } v \neq 0$$

and $x(t) = r(t) + jq(t)$

In order to generate the analytic signal in demodulation and frequency transposition equipment, the signal r(t) is mixed in conventional manner both with a sinewave from a local oscillator at an appropriate frequency, and with a sinewave which is offset by $\pi/2$ relative to the first.

The result of this operation is to provide two signals which are derived from r(t), namely a first signal r'(t) which is a mere transposition of r(t) in the frequency spectrum, and a second signal q'(t) which is in quadrature with of r'(t). Such that $X'(t) = r'(t) + jg'(t)$ fully represents all of the characteristics of r(t).

It is then possible to use a digital method to produce a signal such as a sinewave for generating the above-defined analytic signal.

FIG. 1 is a diagram representing a sinewave signal containing noise in the real signal, where:

$$r(t) = A \cos(wt + \Phi) n(t)$$

w = angular frequency
$\Phi$ = phase
n(t) = relative noise.

This signal may be associated with the analytic signal written as follows:

$$X(t) = A \exp[j(wt + \Phi)] + n^*(t) \text{ with}$$
$$<|n^*(t)|^2> = 2\sigma^2$$

where < > designates the mean value of the quantity between the arrowheads.

Figure 4:
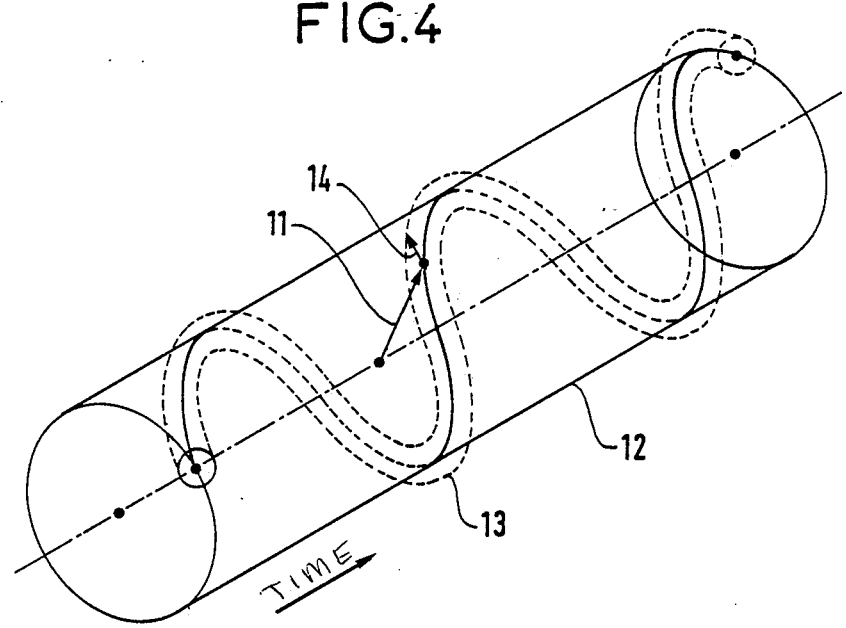

FIG. 4 is a cylindrical representation of an analytic signal. It shows the noise-free signal 11, the cylindrical envelope 12 of the signal, the envelope 13 of noise $\sigma$, and the value 14 of n(t). The power of the useful signal is $A^2/2$ and the noise variance is:

$$\sigma^2 = <n^2(t)>$$

The Hilbert transform serves to associate therewith a signal of the form:

$$q(t) = A \sin(wt + \Phi) + n'(t), \text{ with } <n'^2(t)> = \sigma^2$$

From which it can be deduced that the corresponding analytic signal is of the form:

$$x(t) = A \exp[j(wt + \Phi)] + n^*(t), \text{ where}$$
$$<|n^*(t)|^2> = 2\sigma^2$$

The signal to noise ratio $\rho$ of all three signals r(t), q(t), and x(t) is the same and is given by:

$$\rho = A^2/2\sigma^2$$

The analytic signal is determined with periodicity T which is fixed as a function of the uncertainty $\Delta w$ with which the angular frequency is known:

$$w = w_0 + \Delta w$$

By sampling the real signal, it is possible to obtain at each instant $t_n$ a phase value $\Phi_n$ modulo $\pm \pi$ (i.e. lying in the interval $-\pi$ to $+\pi$), i.e.

$$x(t) = A \exp(j\Phi_n)$$

$$t = t_n$$

Thus $w_0 t_n = w_0(t_n - T) + w_0$ $$\Phi_n = (\Phi_{n-1} + w_0 t_n) \text{ modulo } \pm \pi$$

Using the following notation:
$\Delta \hat{w}$ = the estimated value of the error in the estimated frequency
$\hat{\Phi}$ = the estimated value of the phase
$\delta w$ = the error in the frequency estimate
$\delta \Phi$ = the error in the phase estimate
It is possible to write $\Phi_n$ in the form:

$$\Phi_n = [(\Delta \hat{w}) t_n + \hat{\Phi} + (\delta w) t_n + \delta \Phi] \text{mod } \pm \pi$$

Figure 2:
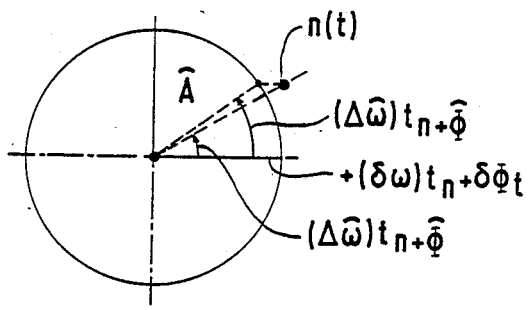

One such signal sample at instant $t_n$ and obtained using estimates, is shown in FIG. 2.

in order to estimate the quantities $\Delta \hat{w}$ and $\hat{\Phi}$, it is necessary to develop the phase so as to eliminate the modulo folding and thus reduce the problem to one of estimating the two characteristic parameters of a straight line.

The sampling period T makes it possible to make a connection without ambiguity between the phases of two successive samples. If the uncertainty in the angular frequency is $\Delta w$, then the sinewave being analyzed must rotate through less than $\pi/2$ between two successive samples, and the noise band must be less than $\frac{1}{2}T$.

$$1 < T/(2|\Delta w|)$$

This condition is necessary and sufficient. The noise cannot give rise to a phase error of more than $\pm \pi/2$ which, when added to the range of uncertainty on the sinewave ($\pm \pi/2$), gives a range of uncertainty which is less than one turn ($\pm \frac{1}{2}$ turn).

Thus, using a unit of time equal to the sampling period (so that t is a relative integer), the algorithm for calculating the developed phase may be described as follows:
$\Phi_t$ = the developed phase
$\phi_t$ = the signal phase modulo $\pm$]
$\Delta \Phi$ = the error in the developed phase between two successive samples.

$$\Delta \Phi = \phi_{t+1} - \phi_t \text{ if } -\pi \leq \phi_{t+1} - \phi_t < \pi$$

$$\Delta \Phi = \phi_{t+1} - \phi_t - 2\pi \text{ if } \phi_{t+1} - \phi_t < \pi$$

$$\Delta\Phi = \phi_{t+1} - \phi_t + 2\pi \text{ if } \phi_{t+1} - \phi_t < -\pi$$

$$\Phi_{t+1} = \Phi_t + \Delta\Phi$$

Figure 3:
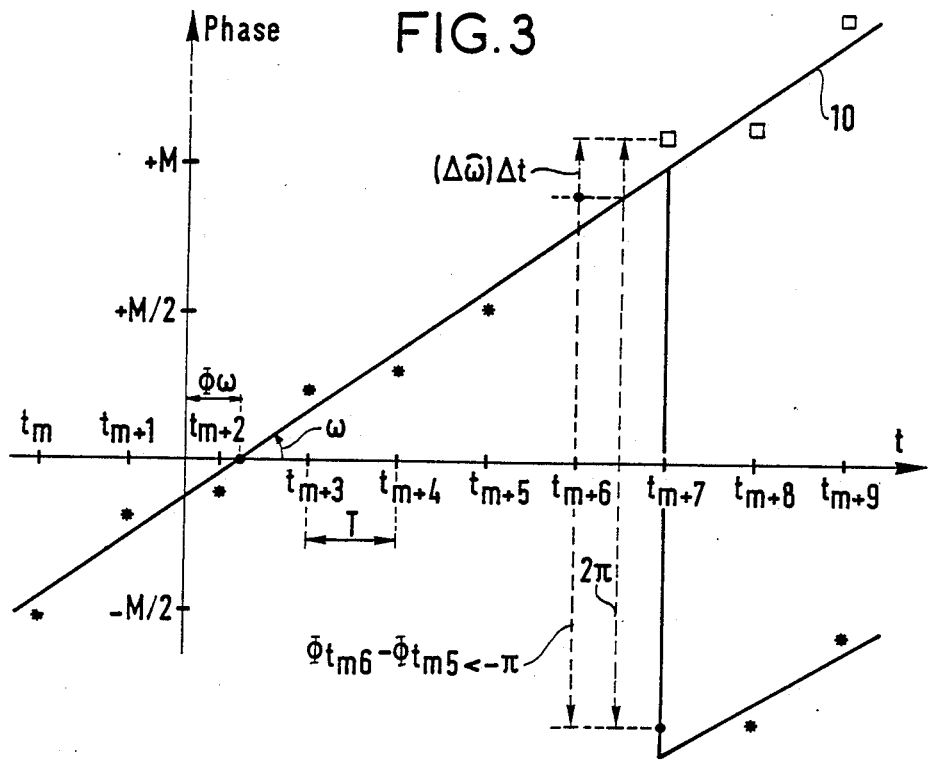

FIG. 3 shows how the operation of constructing the developed phase is performed.

Straight line 10 is a theoretical phase line and:
* = the measured value of the sample phase; and
□ = the calculated value of the developed phase (where different form the measured value).

The expressions described above can be summarized by:

$$\Delta\Phi = (\Phi_{t+1} - \Phi_t) \bmod \pm\pi$$

Using the above construction, the developed phases may be explained by:

$$\Phi_{tn} = (\Delta\hat{w})t_n + \hat{\Phi} + (\delta w)t_n + \delta\Phi_{tn}$$

which is applicable regardless of t (modulo term omitted).

Non-biased estimators are now used to estimate the frequency and the phase, i.e. estimators such that: $<\delta w> = <\delta\Phi> = 0$, where $\delta w$ and $\delta\Phi$ represent estimate errors. Assuming that amplitude samples of the real signals r(t) and q(t) as described above are available, then the sampled phase at each sampling instant $t_n$ is given by:

$$\phi_{tn} = \text{Arctan}[q(t_n)/r(t_n)]$$

Work is then performed on the phase samples obtained in this way. Starting from the equation:

$$\Phi_{tn} = (\Delta\hat{w})t_n + \hat{\Phi} + (\delta w)t_n + \delta\Phi_{tn}$$

and taking the time origin as being in the middle of the estimation range T which includes the sample under consideration, the two sides of the equation are summed over T and the mathematical expectation of the result is taken. This gives:

$$\hat{\Phi} = (1/l)\Sigma_t \Phi_{tn} \text{ where } \Sigma_t t_n = 0$$

and l is the number of samples taken into account.

multiplying both sides of the same equation by $t_n$ prior to summing over T and taking the mathematical expectation then gives $\Delta\hat{w}$:

$$\Delta\hat{w} = (\Sigma_t t_n \Phi_{tn})/(\Sigma_t t_n^2)$$

The variance and covariance of each estimated quantity can then be calculated:

$$<(\hat{\Phi} - \Phi)^2> = (1/l)\sigma_o^2 = (1/l)(\sigma^2/A^2) = 1/(2l\rho)$$

where $\rho A^2/\sigma^2$

Since the $\delta\Phi_t$ are decorrelated therewith and of variance $\sigma_o^2 = \sigma^2/A^2$ $$<(\Delta\hat{w} - \Delta w)^2> = \sigma_o^2/\Sigma_t t_n^2 \approx 12\sigma_o^2/l^3 t^2$$
$$= (12/l)[\sigma_o^2/(l)[\sigma_o^2/lT)^2]$$

$$<(\Delta\hat{w} - \Delta w)(\hat{\Phi} - \Phi)> = 0$$

It should be observed that the parameters are directly related either to the form factor of the observed signal, or else to the signal to noise ratio thereof ($\rho$).

It can be shown that if the input noise gives rise to phase noise having Gaussian distribution, then these estimators are optimal in the sense of likelihood maximum and of root mean square error.

As described above, combined use of the analytic signal and of estimators based on the construction of the developed phase associated with the phase of the analytic signal modulo $\pm\pi$ makes it possible to obtain an estimated value of the phase and of the frequency of the analyzed signal, given by:

$$\hat{\Phi} = (1/l)\Sigma_t \Phi_{tn}$$

$$\Delta\hat{f} = (\tfrac{1}{2}\pi)\Delta\hat{w} = (\tfrac{1}{2}\pi)[\Sigma_t t_n \phi_{tn})/(\Sigma_t t_n^2)]$$

where $\Delta\hat{f}$ is the error relative to the expected frequency $f_O$.

Since this estimator is non-biased, an estimate error is obtained which is zero on average and which has a standard deviation given by:

$$(\Delta\hat{w} - \Delta w)^2 = (12/l)[\sigma_o^2/(lT)^2]$$

with
$\sigma_o^2 = \sigma_2/A^2$
$\sigma^2 = <n^2(t)>$ (noise variance)
l = the number of samples taken into account
T = the sampling period.

These results are valid only if the condition that the noise band of the signal is less than $\tfrac{1}{2}T$ is satisfied.

Figure 5:
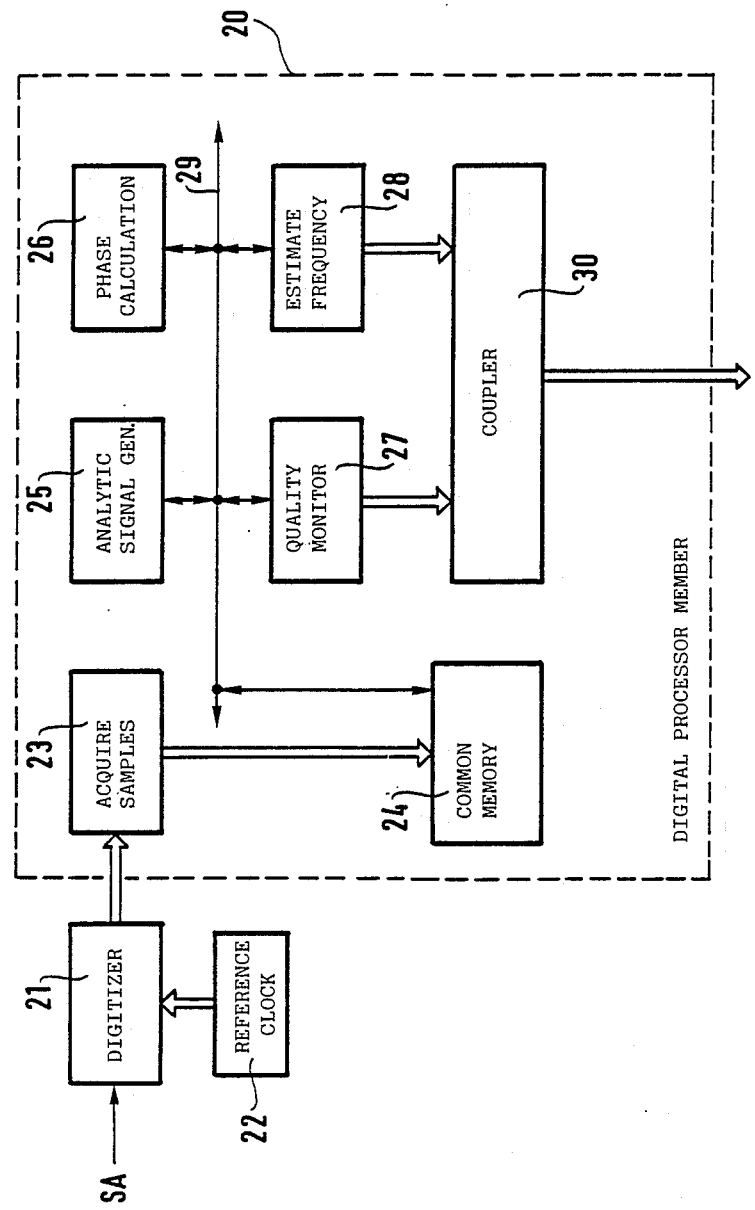

If this is true, it is possible to constitute a frequencymeter having the structure shown in FIG. 5.

Such a frequencymeter comprises a digital processor member 20 having an input to which the signal to be analyzed SA is applied after passing through a digitizer 21 which also receives a reference clock 22 and having outputs providing a quality signal and a frequency measurement signal.

The digital processor member comprises:
- a common memory circuit 24;
- a circuit 25 for generating the analytic signal;
- a circuit 26 for calculating phase samples of the analytic signal and for constructing the developed phase;
- a circuit 27 for monitoring the quality of the signal enabling statistical estimates to be made of errors using the estimated sinewave and enabling noise to be estimated as a function of the form of the signal to be analyzed;
- a frequency estimating circuit 28;
- with all of the above circuits being interconnected by a both-way link to an interconnection bus 29;
- a digitized sample acquisition circuit connected to the input and also connected to the common memory 24 over a one-way link; and
- a coupler 30 whose inputs are connected to the outputs from the quality monitor circuit 27 and the frequency-estimating circuit 28, and whose output constitutes the output from said processor member 20.

In the block diagram shown, the signal to be analyzed is sampled using a stable reference clock, and is digitized using conventional principles: with analog-to-digital conversion having characteristics (speed, sampling rate, linearity, . . . ) which are critical for obtaining desired performance in frequency measurement accuracy and in estimating the quality of the signal.

The noise specific to digitizing must be negligible compared with the parameters to be acquired.

The samples obtained in this way are acquired and are stored in a digital processor unit having an addressable memory of adequate size for enabling each of the samples required for estimation purposes to be accessed as many times as desirable by any of the individual processing circuits.

In accordance with the invention, each of the processing circuits is completely independent from the other circuits and can address the memory in order to read therefrom any of the results obtained by the other circuits together with the signal samples originally written therein, and also together with its own results, and which can write the results of its own calculations in a specific zone of said memory which is attributed to it alone.

In a phasemeter, as shown in FIG. 6, circuits which are identical to those used in the FIG. 5 frequencymeter have the same reference numerals.

Said phasemeter includes a second digitizer 31 which receives a phase reference signal SR and the stable reference clock 22.

The digital processor member 40 further includes:

a second digital sample acquisition circuit 33 for acquiring samples of the phase reference signal, and for storing them in the same manner as the first acquisition circuit 23 in the common memory circuit 24; and a circuit 38 for estimating phase in conjunction with the phase reference signal, and for estimating jitter.

In both of these two devices (frequencymeter, phasemeter), the following operations take place successively:

(A) Digitizing the real signal to be analyzed

The signal is digitized using conventional methods performed by components which are available on the market. The characteristics selected for digitizing should take account of the signal that is to be analyzed in order to avoid adding error to the resulting estimates.

The main characteristics are as follows:

(a) sampling frequency and anti-aliasing filter.

The selected sampling frequency should have a value $F_e$ which is compatible with the frequency band $\Delta F_n$ of the noise signals associated with the signal to be analyzed, such that:

$$F_e > 2\Delta F_n$$

The anti-aliasing filter preceding the digitizer should be defined for the purpose of limiting the band of the signals to be digitized to one half of the sampling frequency, with the characteristics within the band depending on the transfer function of the sampler.

(b) sampler linearity; and (c) quantification characteristics.

The number of quantification steps and the accuracy and stability of the corresponding thresholds should have a negligible effect on the final results.

(B) Transformation of the samples

The samples of the real signal coming from the digitizer are transformed into a sampled analytic signal, in particular by calculating samples of the quadrature signal from a group of samples of the real signal.

One of the possible methods which may be adopted when using a sampling frequency which is high relative to the band of the signal to be digitized is as follows:

Define a sampling frequency which is an integer multiple of a frequency which if four times greater than the band of the frequency to be analyzed (i.e. N times greater).

Take the consecutive samples into account by taking one pair every N samples. The first of each pair of samples taken into account is representative of the real signal and the second is representative of the quadrature signal (offset by $\pi/2$ relative to the initial sampling period).

This method requires a sampling frequency which is high relative to the band to be analyzed.

When this condition is not satisfied, it is necessary to interpolate the input real signals in order to obtain two sampled in quadrature with the equivalent real signal.

The analytic signal can also be stored in the form of complex samples $[n^*(t)+jq^*(t)]$ appearing at a rate $F_{SA} > \Delta F_n/2$, where $\Delta F_n$ represents the frequency band of the signal being processed.

On the basis of the complex samples of the analytic signal, samples are generated of the associated phase and of the developed phase, as described above.

Using the above-described estimators, the following are deduced therefrom:

the estimated frequency and phase values of a sinewave; and the variance and the covariance of the estimated quantities using the input signal as a reference.

Thus, taking the number of samples taken into account as the parameter, the following are obtained:

the value of the frequency;

the value of the phase; and the estimation noise of the measurement.

This last item can be used to monitor the quality of the measurement compared with any desired degree of accuracy. This estimation noise sums up all of the noise regardless of the origin thereof:

noise added to the signal;

non-linearity in the chain to be measured, with non-linearity in the measuring apparatus being eliminated or at least reduced to negligible values compared with the desired accuracy;

phase noise from the local oscillator in the chain to be measured;

the form factor of the signals to be analyzed (it may be necessary to measure rectangular signals, triangular signals, Gaussian signals, etc.) with the resulting noise then being due to harmonics;

estimate errors in the measurement chain related to the estimators.

Since the signal is sinusoidal, the following procedure is used: starting from frequency and phase estimation the theoretical sinusoidal signal deduced from the estimation is modelled.

Phase variance is proportional to noise and inversely proportional to the number of samples. The quality of the phase measurement can therefore be determined from the number of samples taken into account and the variance of the calculated phase, and the signal-to-noise ratio of the signal being tested can be deduced therefrom:

$$A^2/\sigma^2 = 1/l < (\hat{\Phi} - \Phi)^2 >$$

By evaluating the variance in the frequency estimate, it is possible to define the number of samples that need to be taken into account, for given noise $\sigma_o^2$ (see above), in order to be sure of avoiding ambiguity in estimate accuracy.

If the shape of the signal is known, the corresponding signal is modelled with estimated amplitude phase and frequency, and it is then possible to proceed as though the signal were a sinewave.

The method of the invention thus makes it possible:

when the noise degrading the signal to be measured is not known, to adjust the duration of the signal taken into account in order to cause phase variance to be small and to evaluate:

$A^2/o^2$ of the signal to be measured;

the corresponding accuracy in the frequency measurement;

the phase value;

the frequency value; and if the shape of the signal is not known, to model the shape in order to obtain the harmonic content of the signal to be measured and thus deduce other items therefrom;

otherwise, if the type of noise added to the signal and the envelope thereof are known, it is possible to model the noise in order to take it account when evaluating other disturbances;

harmonic disturbances;

phase noise; . . . .

Naturally, the present invention has been described and shown purely by way of preferred example, and its component parts could be replaced by equivalent items without thereby going beyond the scope of the invention.

Any hardware architecture capable of satisfying the following conditions may be used for implementing the invention:

tasks are shaped between different calculating members which operate independently from one another;

all of the above-defined calculating members have read access to all of the results of tasks performed by the other members. This type of access may be organized, for example, about addressable memories which are accessible over a common or "multi-port" bus, or else using memories which are connected in a lattice network which interconnects the various calculating members; and each of the calculating members has exclusive authority to write in a specific zone of the memory (or memories).

In this way, the various circuits of devices implementing the method of the invention (frequencymeters, phasemeters) may also be replaced by different estimation functions which are implemented in calculating members constituted by software.

We claim:

1. A method of digitally evaluating at least one desired parameter of an input signal, said input signal being in the form of digitized samples having sample values, wherein the method comprises the steps of:

deriving an analytic signal from said sample values, said analytic signal having a real portion which coincides with said digitized samples;

calculating, in accordance with said sample values, phase values corresponding to the phase of said input signal;

estimating said desired parameter by operating on said phase values without using any operator of the Fourier transform type or any hypothesis test either separately or simultaneously; and estimating the differences between the real signal as taken in this way and the signal obtained from the estimated parameter, thereby making it possible to deliver data in digital form relating to the quality of the analyzed signal and to the reliability of the estimated values.

2. A method according to claim 1, wherein said calculating step comprises calculating a developed phase of said analytic signal, and wherein said step of estimating said desired parameter is performed by operating on said developed phase.

3. A method according to claim 1, wherein said digitized samples are stored in a memory from which they are extracted as often as may be required by each new calculation, and wherein said data in digital form represents, to within given accuracy, the signal/noise ratio of the input signal, the duration of the input signal to be taken into account, and the accuracy of the evaluation of said desired parameter, with the above being based on a given quality parameter.

4. A method according to claim 1, wherein said step of estimating said desired parameter is performed in parallel with said step of deriving said analytic signal.

* * * * *